United States Patent
Erdmann

(10) Patent No.: US 7,353,316 B2
(45) Date of Patent: Apr. 1, 2008

(54) SYSTEM AND METHOD FOR RE-ROUTING SIGNALS BETWEEN MEMORY SYSTEM COMPONENTS

(75) Inventor: Michael Erdmann, Apple Valley, MN (US)

(73) Assignee: Micron Technology, Inc., Boise, ID (US)

( * ) Notice: Subject to any disclaimer, the term of this patent is extended or adjusted under 35 U.S.C. 154(b) by 110 days.

(21) Appl. No.: 11/388,296

(22) Filed: Mar. 24, 2006

(65) Prior Publication Data

US 2007/0223263 A1    Sep. 27, 2007

(51) Int. Cl.
G06F 12/00 (2006.01)
G11C 5/00 (2006.01)
G06F 11/00 (2006.01)

(52) U.S. Cl. .................. 710/316; 365/52; 711/100; 711/105; 714/5

(58) Field of Classification Search ............... 710/316, 710/317, 100, 300, 305, 31; 709/249–250, 709/253; 711/1, 100, 105, 154; 365/230.02, 365/52; 714/1–5
See application file for complete search history.

(56) References Cited

U.S. PATENT DOCUMENTS

| | | | |
|---|---|---|---|
| 4,943,952 A | 7/1990 | Terayama | 365/207 |
| 5,276,834 A | 1/1994 | Mauritz et al. | 395/425 |
| 5,530,814 A | 6/1996 | Wong et al. | 395/312 |
| 5,629,900 A | 5/1997 | Hirose et al. | 365/230.03 |
| 6,069,831 A | 5/2000 | Jang et al. | 365/210 |
| 6,314,500 B1 | 11/2001 | Rose | 711/148 |
| 7,069,394 B2 | 6/2006 | Arimilli et al. | 711/148 |
| 7,088,134 B1 | 8/2006 | Agrawal et al. | 326/41 |
| 7,127,629 B2 | 10/2006 | Vogt | 713/500 |
| 7,194,581 B2 * | 3/2007 | Vogt | 711/131 |
| 7,200,787 B2 * | 4/2007 | Vogt et al. | 714/738 |
| 7,212,423 B2 * | 5/2007 | Vogt | 365/52 |
| 7,219,294 B2 * | 5/2007 | Vogt | 714/758 |
| 7,245,663 B2 * | 7/2007 | Van Der Schaar et al. | 375/240.26 |
| 2004/0111575 A1 | 6/2004 | Arimilli et al. | 711/162 |
| 2004/0246767 A1 | 12/2004 | Vogt | 365/154 |
| 2004/0246785 A1 | 12/2004 | Vogt | 365/199 |
| 2004/0250181 A1 | 12/2004 | Vogt et al. | 714/718 |
| 2005/0108458 A1 | 5/2005 | Vogt | 711/1 |
| 2005/0108611 A1 * | 5/2005 | Vogt | 714/758 |
| 2005/0268061 A1 * | 12/2005 | Vogt | 711/167 |
| 2005/0276150 A1 * | 12/2005 | Vogt | 365/233 |
| 2006/0004953 A1 * | 1/2006 | Vogt | 711/105 |
| 2006/0004968 A1 * | 1/2006 | Vogt | 711/154 |
| 2006/0212775 A1 | 9/2006 | Cypher | 714/758 |
| 2007/0124548 A1 * | 5/2007 | Vogt | 711/154 |
| 2007/0156993 A1 * | 7/2007 | Alexander et al. | 711/167 |

\* cited by examiner

Primary Examiner—Gopal C. Ray
(74) Attorney, Agent, or Firm—Dorsey & Whitney LLP

(57) ABSTRACT

A plurality of memory modules used in a computer system each include a memory hub that is connected to a plurality of memory devices. The memory modules are connected to each other in series so that signals are coupled between the memory modules and the memory hub controller through any intervening memory modules. The signals are coupled to and from the memory modules through high-speed bit-lanes. In the a bit-lane connected to any of the memory hubs is inoperative, the memory hub re-routes signals that would be coupled through the inoperative bit-lane to an adjacent bit lane. When the signal reaches a memory hub in which the bit-lane is no longer inoperative, the memory hub routes the signal back to the original bit lane. In this manner, multiple bit-lane failures can be accommodated using a signal extra bit-lane.

19 Claims, 7 Drawing Sheets

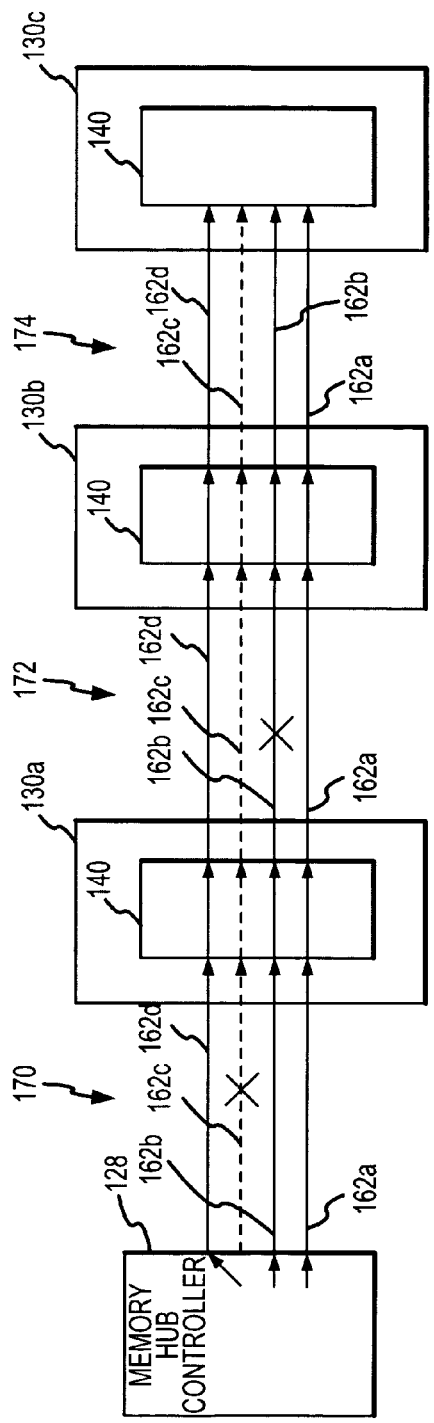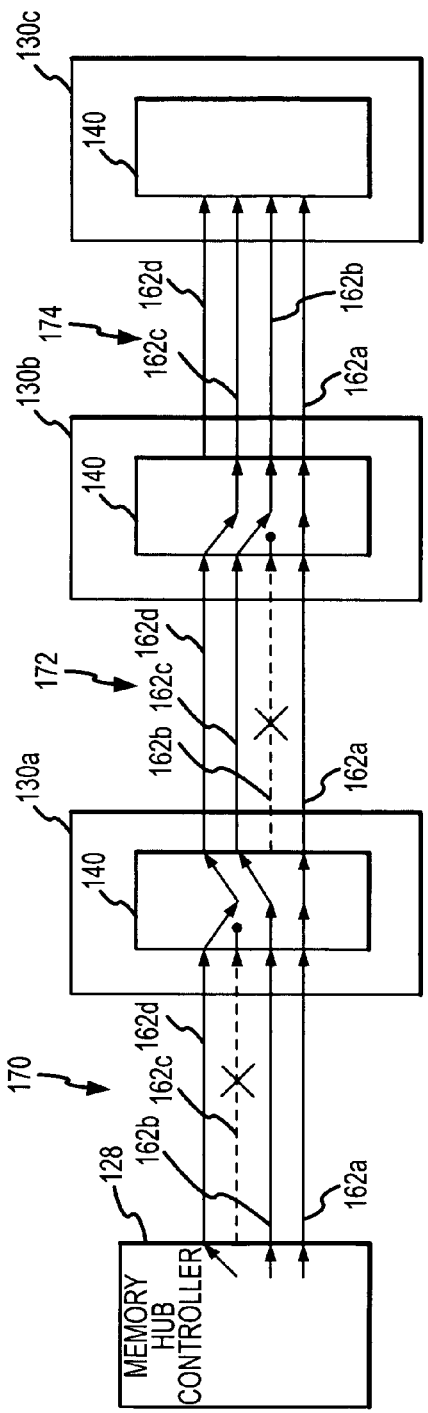

SYSTEM AND METHOD FOR RE-ROUTING SIGNALS BETWEEN MEMORY SYSTEM COMPONENTS

TECHNICAL FIELD

This invention relates to memory systems, and, more particularly, to a memory system having a memory controller or the like coupled to several memory modules, each of which may have a memory hub architecture.

BACKGROUND OF THE INVENTION

Computer systems use memory devices, such as dynamic random access memory ("SDRAM") devices, to store instructions and data that are accessed by a processor. In a typical computer system, the processor communicates with the system memory through a processor bus and a memory controller. The processor issues a command, such as a read command, and an address designating the location from which data or instructions are to be read. The memory controller uses the command and address to generate appropriate command signals as well as row and column addresses, which are applied to the system memory. In response to the commands and addresses, data are transferred between the system memory and the processor. The memory controller is often part of a system controller, which also includes bus bridge circuitry for coupling the processor bus to an expansion bus, such as a PCI bus.

Although the operating speed of memory devices has continuously increased, this increase in operating speed has not kept pace with increases in the operating speed of processors. Even slower has been the increase in operating speed of memory controllers coupling processors to memory devices. The relatively low speed of memory controllers and memory devices limits the communication bandwidth between the processor and the memory devices.

One approach to increasing memory bandwidth is to use multiple memory modules coupled to the processor through a memory controller or the like. Each of the memory modules can have a memory hub architecture in which a memory hub is coupled to several memory devices, such as DRAM devices. The memory hub in each of the memory modules can be coupled to the memory controller through a plurality of high-speed bit-lanes. Computer systems employing this architecture can have a higher bandwidth because a processor can access one memory device while another memory device is responding to a prior memory access. For example, the processor can output write data to one of the memory devices in the system while another memory device in the system is preparing to provide read data to the processor.

A conventional computer system 100 having a memory hub architecture is shown in FIG. 1. The computer system 100 includes a processor 104 for performing various computing functions, such as executing specific software to perform specific calculations or tasks. The processor 104 includes a processor bus 106 that normally includes an address bus, a control bus, and a data bus. The processor bus 106 is typically coupled to cache memory 108, which, as previously mentioned, is usually static random access memory ("SRAM"). Finally, the processor bus 106 is coupled to a system controller 110, which is also sometimes referred to as a "North Bridge."

The system controller 110 serves as a communications path to the processor 104 for a variety of other components. More specifically, the system controller 110 includes a graphics port that is typically coupled to a graphics controller 112, which is, in turn, coupled to a video terminal 114. The system controller 110 is also coupled to one or more input devices 118, such as a keyboard or a mouse, to allow an operator to interface with the computer system 100. Typically, the computer system 100 also includes one or more output devices 120, such as a printer, coupled to the processor 104 through the system controller 110. One or more data storage devices 124 are also typically coupled to the processor 104 through the system controller 110 to allow the processor 104 to store data or retrieve data from internal or external storage media (not shown). Examples of typical storage devices 124 include hard and floppy disks, tape cassettes, and compact disk read-only memories (CD-ROMs).

The system controller 110 also includes a memory hub controller 128 for controlling access to several system memory modules 130a-n. Each of the memory modules 130a-d includes a substrate 134 on which a memory hub 140 and a plurality of memory devices 148 are mounted. The memory devices 148 may be SDRAM devices or some other type of memory devices. The memory devices 148 are coupled to the memory hub 140 through a bus system 150 that normally includes a command bus, an address bus and a data bus. The memory hub controller 128 is coupled to the memory hubs 140 in the respective memory modules 130a-d through several high speed downstream bit-lanes 162 and several high speed upstream bit-lanes 164. Each of the downstream bit-lanes 162 includes a signal line to couple signals from the memory hub controller 128 to the memory hubs 140 in the memory modules 130a-n. Similarly, each of the upstream bit-lanes 164 includes a signal line to couple signals from the memory hubs 140 in the memory modules 130a-n to the memory hub controller 128. In the computer system 100 example of FIG. 1, the signals coupled through the bit lanes 162, 164 are in the form of packets. The packets coupled through the downstream bit-lanes 162 generally include memory commands, addresses and write data. The packets coupled through the upstream bit-lanes 164 generally include read data and acknowledgement signals. However, if the memory hubs 140 include the capability of reading data from or writing data to other memory modules 130a-n, the packets coupled through either of the bit-lanes 162, 164 may include memory commands, addresses, write data, read data and acknowledgment signals. However, other means of coupling signals between the memory hub controller 128 and the memory modules 130a-n, including dedicated command, address, write data and read data lines. In the computer system 100 shown in FIG. 1, there are 10 downstream bit lanes 162a-j and 14 upstream bit lanes 164a-n. However, different numbers of bit lanes 162, 164 may be used. However, in several of the examples described below, only 4 bit lanes 162a-d are shown and described for purposes of clarity and simplicity.

The bit-lanes 162, 164 are divided into segments between respective memory modules 130a-n. More specifically, the memory hub controller 128 is coupled to the memory hub 140 in the first memory module 130a through a first segment 170 of the bit-lanes 162, 164 and through a connector 190 on the substrate 134. The memory hub 140 in the second memory module 130b is connected to the memory hub controller 128 through a second set of bit-lane terminals of the memory hub 140 in the first memory module 130a, which are connected to a second connector 192 on the substrate 134. The signals are thus coupled between the memory hub 140 in the second memory module 130b using the first segment 170 of the bit-lanes 190, 192 as well as a second segment 172 of the bit-lanes 190, 192. Similarly, the memory hubs 140 in the remaining N−2 memory modules 130 are connected to the memory hub controller 128 in the same manner through the first and second memory modules 130a,b, the first and second bit-line segments 170, 172, respectively, and through any intervening memory modules 130 and bit-line segments.

In operation, the memory hub 140 in each of the memory modules 130a-c can processes the signals coupled through the bit-lanes 160-166 in one of two ways. First, if signals emanating "downstream" from the memory module 130 are being coupled to the memory hub controller 128 or signals from the memory hub controller 128 are being coupled to a downstream memory module 130, the memory hub 140 in the memory module simply passes the signals from each of the bit-lanes 162, 164 in one segment to the corresponding bit-lanes 162, 164 in the other segment. However, if the signals coupled through the bit-lanes 162, 164 are for accessing one or more of the memory devices 148 on the memory module 130, the signals are coupled to and from the memory hub 140 for that module 130. The memory hub 140 then uses signals received from the memory hub controller 128 to generate signals for accessing the memory devices 148.

The memory hub architecture used in the computer system 100 allows the processor 104 to more efficiently write data to and read data from each of the memory devices 148. For example, the processor 104 can issue a read command to an address in a memory device 148 in the memory module 130a. During the time that the memory hub 140 in the memory module 130a issues a corresponding read command to the addressed memory device 148 in the memory module 130a and the memory device 148 responds to the read command, the processor 104 can issue a memory command to a different memory module 130, or it can perform a function other than accessing a memory device. When the read data is ready to be sent from the memory module 130a, the processor can again communicate with the memory hub 140 in the memory module.

Processor-based systems using a memory hub architecture can have configurations other than the configuration shown in FIG. 1. For example, devices other than the processor 104 may access the memory modules 130 through the memory hub controller 128. Also, the memory hub controller 128 may be a stand-alone unit or physically included as a part of components of an electronic system other than the system controller 110. Other modifications and variations will be apparent to one skilled in the art.

Each of the downstream bit-lanes 162 or each of the upstream bit-lanes 164 may be each assigned to pass specific signals, such specific bits of a packet. However, the bit-lanes 162, 164 are also sometimes assigned on a flexible basis so that, if all or a portion of a bit-lane becomes defective, another bit-lane can be substituted for the defective bit-lane. In fact, in some systems, an extra bit-lane can be provided specifically for this purpose. One example of the flexible assignment of bit-lanes is schematically illustrated in the portion of the computer system 100 shown in FIG. 2. As shown in FIG. 2, the bit-lane 162c in the first segment 170 has become defective for one of a variety of reasons. The conductor for the bit-lane 162c may have become open-circuited or short-circuited, or an electrical component connected to the bit-lane 162c in the memory hub controller 128 or in the memory hub 140 in the memory module 130a may have become defective. In such case, the memory hub controller 128 re-routes signals that would normally pass through the bit-lane 162c to the extra bit-lane 162d. The computer system 100 can therefore continue to function despite the inoperable bit-lane 162c in the first bit-line segment 170.

The substitution of an extra bit-lane 162d for a defective bit-lane 162c works well if only one bit-lane is inoperable. However, if two or more bit-lanes have become inoperable, this substitution procedure will not suffice unless two extra bit-lanes have been provided. For example, as shown in FIG. 3, the bit-lane 162c has become inoperable in the first bit-line segment 170, and the bit-lane 162b has become inoperable in the second bit-line segment 172. In such case, only two bit-lanes 162a, 162d will remain operable to pass signals from the memory modules 130b-c, although three bit-lanes remain operable to pass signals from the memory module 130a. However, the system shown in FIG. 3 generally becomes inoperable if two or more bit-lanes 162 in any segment 170-176 becomes inoperable.

There is therefore a need for a memory system architecture that allows a memory system to be repaired by bit-lane substitution despite failures in multiple bit-lanes.

SUMMARY OF THE INVENTION

A memory hub may be used coupled to a plurality of memory devices in a memory module. The memory hub includes a first plurality of bit-lane terminals for coupling to either a memory hub controller or the memory hub of another memory module. The memory hub also includes a second plurality of bit-lane terminals that may be coupled to the bit-lane terminals in the first plurality of the memory hub in another memory module. The memory hub includes a switch coupled to the bit-lane terminals in the first and second plurality and to the at least one memory device interface. The switch includes a switching circuit that is operable to couple at least some of the bit-lane terminals in the first plurality to a respective one of the bit-lane terminals in the second plurality if the bit-lane connection to the memory hub controller or to another memory hub is operable. If a bit-lane connection to the memory hub controller or to another memory hub is inoperable, the switching circuit is operable to couple the corresponding bit-lane terminal in the first plurality to at least one other bit-lane terminal in the second plurality.

BRIEF DESCRIPTION OF THE DRAWINGS

FIG. 3 is a block diagram of a portion of the computer system of FIG. 1 showing the manner in which the computer system operating in a conventional manner is unable to couple signals between memory modules in the event of multiple bit-lane failures.

FIG. 5 is a block diagram of a portion of the computer system of FIG. 1 showing the manner in which the computer system operating according to one example of the invention is able to couple signals between memory modules in the event of multiple bit-lane failures.

DETAILED DESCRIPTION OF THE INVENTION

Figure 2:
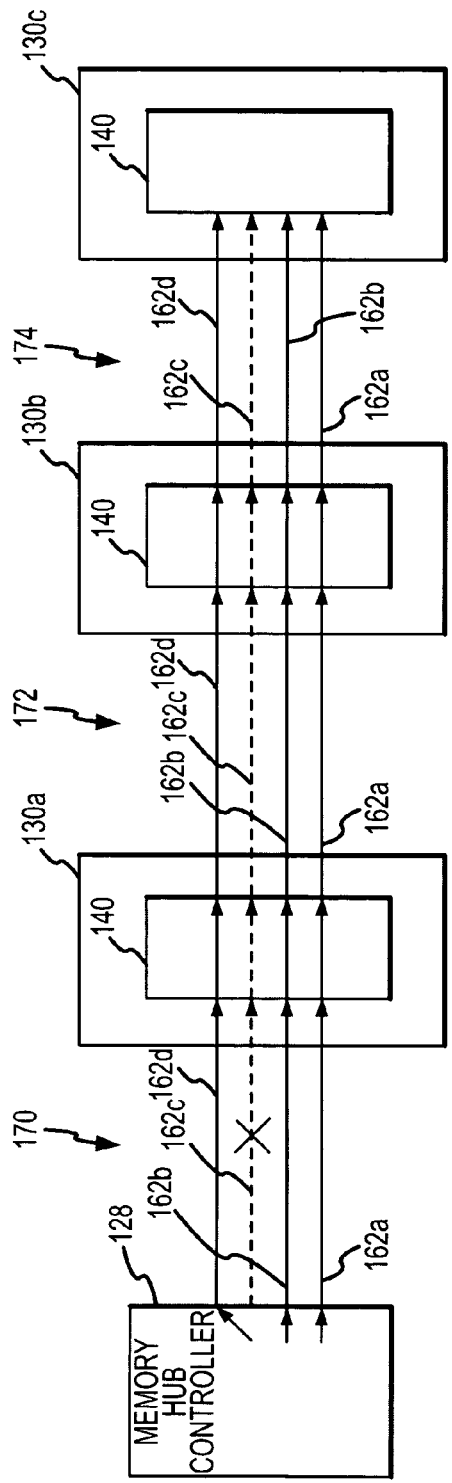
FIG. 2 is a block diagram of a portion of the computer system of FIG. 1 showing the manner in which the computer system conventionally couples signals between memory modules.
Figure 4:
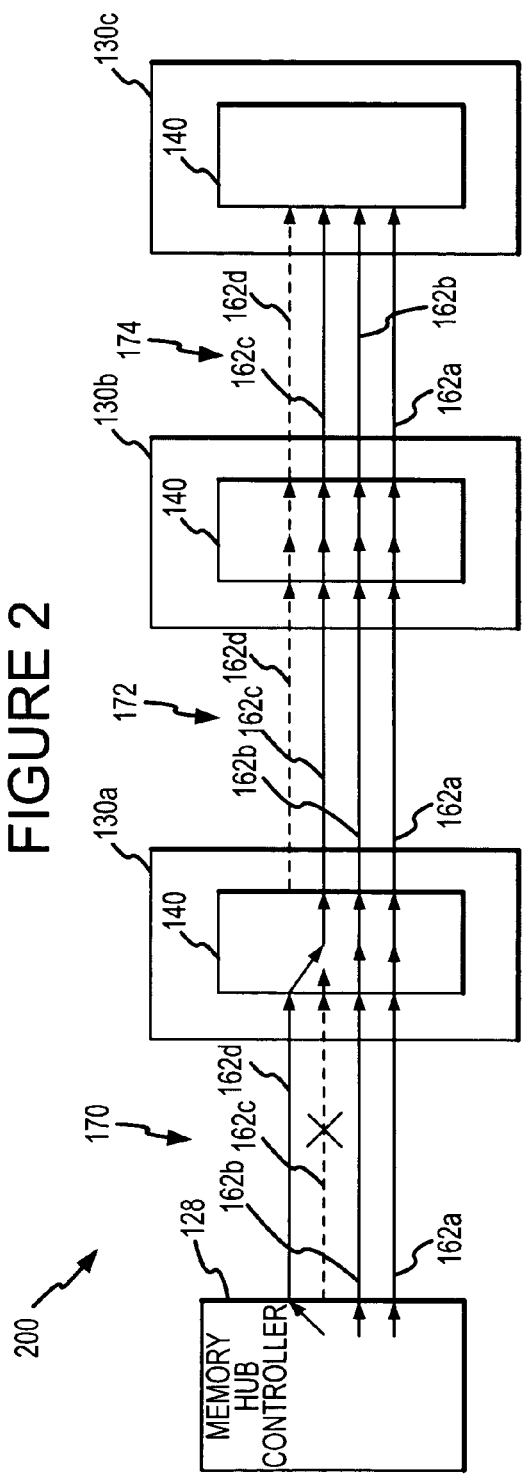
FIG. 4 is a block diagram of a portion of the computer system of FIG. 1 showing the manner in which the computer system couples signals between memory modules according to one example of the invention.

One example of portion of a computer system 200 having a memory hub architecture that can continue to operate in the event multiple bit lanes become defective is shown in FIG. 4. The computer system 200 may have a large number of downstream bit lanes 162 and a large number of upstream bit lanes 164, although only 4 downstream bit lanes 162a-d are shown in FIG. 4 for purposes of simplicity and clarity. As shown in FIG. 4, the bit-lane 162c in the first bit-line segment 170 has become defective. This is the same defect as in the computer system 100 shown in FIG. 2. As in the computer system shown in FIG. 2, the memory hub controller 128 re-routes the signals to and from the bit-lane 162c in the first bit-line segment 170 so they now pass through the bit-lane 162d. However, the memory hub 140 in the first memory module 130a does not simply couple the first segment 170 of the bit-lane 162d to the second segment 172 of the bit lane 162d. Instead, the memory hub 140 in the first memory module 130a couples the first segment 170 of the bit-lane 162d of the second segment 172 of the bit-lane 162c. Thereafter, the signals are routed through the bit-lane 162c in the remaining bit-line segments 172, 174.

The advantage of routing a failed segment of a bit-lane back to the original bit-lane in the remaining bit-line segments will be apparent from the example shown in FIG. 5. As shown therein, the first segment 170 of the bit-lane 162c is inoperable, and the second segment 172 of the bit-lane 162b in inoperable. This pattern of bit-lane failures is thus identical to the situation shown in FIG. 3. However, unlike the computer system shown in FIG. 3, in which only the memory hub controller 128 re-routes signals, the memory hubs 140 in the computer system shown in FIG. 5 also re-route signals coupled through the bit-lanes 162a-d. More specifically, the memory hub controller 128 routes the signals that would be coupled through the first segment 170 of the bit-lane 162c through the bit-lane 162d. The memory hub 140 in the memory module 130a couples the first segment 170 of the bit-lane 162d to the second segment 172 of the bit-lane 162d. The memory hub 140 in the first memory module 130a also couples the first segment 170 of the bit-lane 162b to the second segment 172 of the bit-lane 162c. As a result signals coupled through the first segment 170 of the bit-lane 162b are not coupled through the defective second segment 172 of the bit lane 162b.

With further reference to FIG. 5, in the memory modules 130b,c downstream from the defective bit-lanes 162b, 162c, the memory hubs 140 couple the second segments 172 of the bit-lanes 162c, 162d to the third segments 174 of the bit-lanes 162b, 162c, respectively. Signals are therefore coupled to and from the memory hub 140 in the memory module 130c in their proper order.

Figure 6:
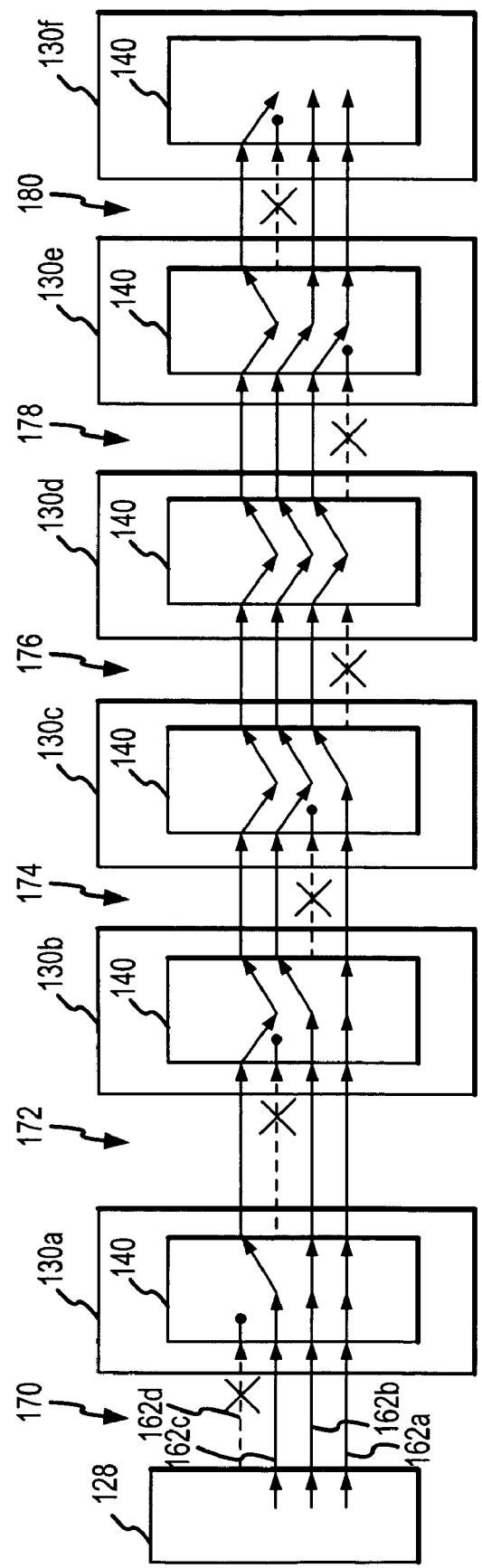
FIG. 6 is a block diagram of a portion of the computer system of FIG. 1 showing the manner in which the computer system operating according to another example of the invention is able to couple signals between memory modules in the event of multiple bit-lane failures.

The flexibility in which signals can be re-routed to repair multiple bit-lane failures using various examples of the invention is further illustrated in the example shown in FIG. 6. As shown therein every one of the bit-lanes 162a-d has at least one inoperative segment, and two of the bit-lanes 162a, 162c are inoperative in two segments. Specifically, the bit-lane 162a is inoperable in segments 176 and 178, the bit-lane 162b is inoperable in segment 174, the bit-lane 162c is inoperable in segments 172 and 180, and the bit-lane 162d is inoperable in segment 170. However, because the memory hubs 140 in the memory modules 130a-f are able to re-route signals to adjacent bit-lanes, the system shown in FIG. 6 remains operational.

Figure 7:
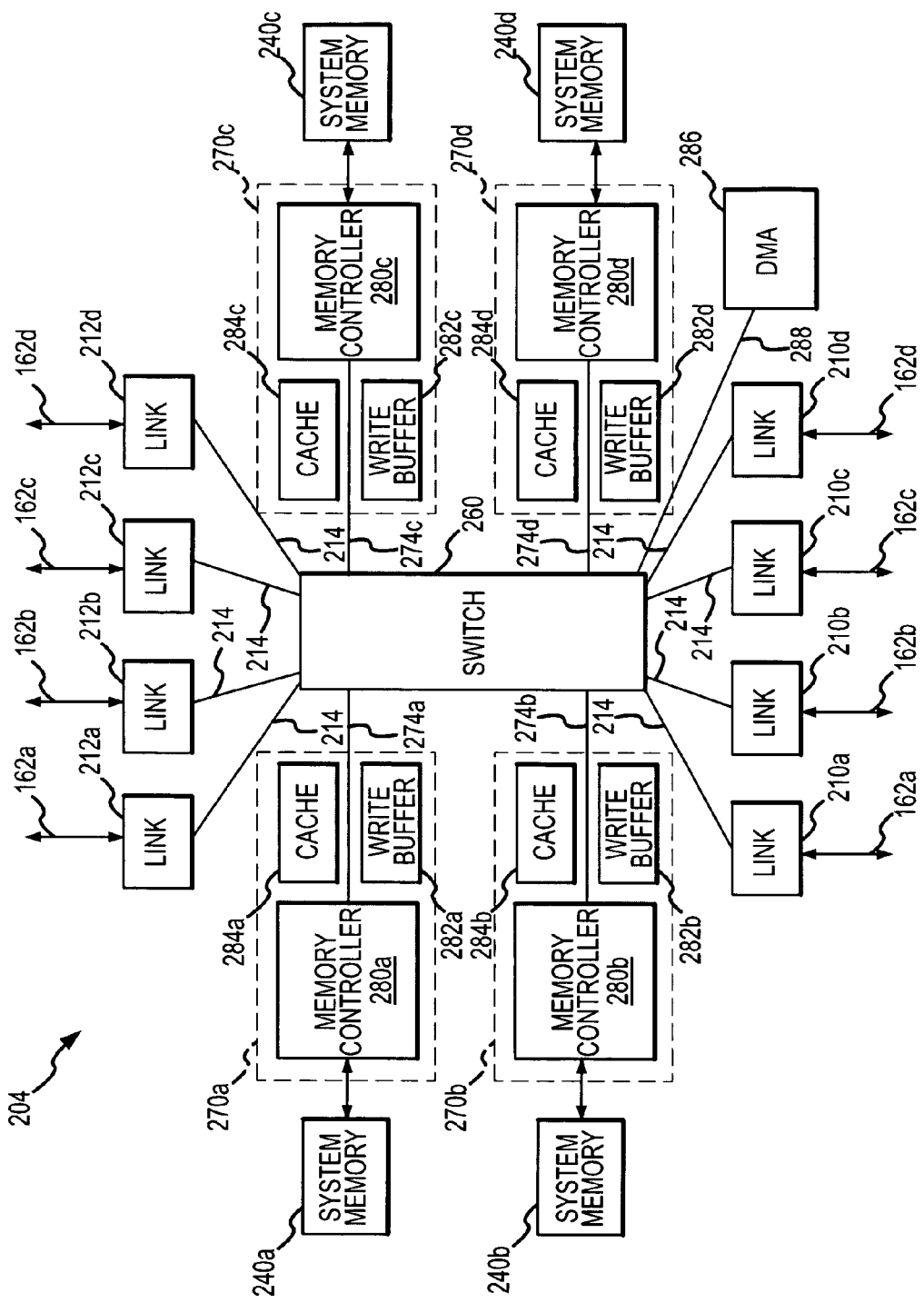
FIG. 7 is a block diagram showing a memory hub according to one example of the invention that may be used in the computer system of FIG. 1.

An example of a memory hub 204 that can be used as the memory hub 140 in one of the computer systems shown in FIGS. 4-6 is shown in FIG. 7. The memory hub 204 is shown in FIG. 7 as being coupled to four different banks 240a-d of memory devices, which, in the present example are conventional SDRAM devices. Further included in the memory hub 204 are link interfaces 210a-d for coupling the memory hub 204 to respective bit-lanes 162a-d in one segment. A second set of link interfaces 212a-d couple the memory hub 204 to respective bit-lanes 162a-d in another bit-line segment. The link interfaces 210a-d, 212a-d may includes conventional transmitter and receiver logic known in the art. It will be appreciated that those ordinarily skilled in the art have sufficient understanding to modify the link interfaces 210a-d, 212a-d to be used with specific types of communication paths, and that such modifications to the link interfaces 210a-d, 212a-d can be made without departing from the scope of the present invention.

The link interfaces 210a-d, 212a-d are coupled to a switch 260 through respective signal lines 214. The link interfaces 210a-d, 212a-allow the memory hub 204 to be connected in the system memory in a point-to-point configuration, as shown in FIGS. 4-6. However, the link interfaces 210a-d and 212a-d could also be used to allow coupling to the memory hubs 204 in a variety of other configurations. The switch 260 is further coupled to four memory interfaces 270a-d which are, in turn, coupled to the banks 240a-d of system memory devices, respectively. By providing a separate and independent memory interface 270a-d for each bank 240a-d of system memory devices, respectively, the memory hub 204 avoids bus or memory bank conflicts that typically occur with single channel memory architectures. The switch 260 is coupled to each memory interface through a plurality of bus and signal lines, represented by busses 274. The busses 274 may include a write data bus, a read data bus, and a request line. However, it will be understood that a single bi-directional data bus may alternatively be used instead of a separate write data bus and read data bus. Moreover, the busses 274 can include a greater or lesser number of signal lines than those previously described.

The switch 260 coupling the link interfaces 210a-d, 212a-d and the memory interfaces 270a-d can be any of a variety of conventional or hereinafter developed switches. The switch 260 may be a cross-bar switch that can simultaneously couple link interfaces 210a-d, 212a-d and the memory interfaces 270a-d to each other in a variety of arrangements. The switch 260 can also be a set of multiplexers that do not provide the same level of connectivity as a cross-bar switch but nevertheless can couple the link interfaces 210a-d to any of the link interfaces 212a-d, and it can couple the link interfaces 210a-d, 212a-d to each of the memory interfaces 270a-d. The switch 260 may also include arbitration logic (not shown) to determine which memory accesses should receive priority over other memory accesses. Bus arbitration performing this function is well known to one skilled in the art.

With further reference to FIG. 7, each of the memory interfaces 270a-d includes a respective memory controller 280, a respective write buffer 282, and a respective cache memory unit 284. The memory controller 280 performs the same functions as a conventional memory controller by providing control, address and data signals to the system memory device 240a-d to which it is coupled and receiving data signals from the system memory device 240a-d to which it is coupled. The write buffer 282 and the cache memory unit 284 include the normal components of a buffer and cache memory, including a tag memory, a data memory, a comparator, and the like, as is well known in the art. The memory devices used in the write buffer 282 and the cache memory unit 284 may be either DRAM devices, static random access memory ("SRAM") devices, other types of memory devices, or a combination of all three. Furthermore, any or all of these memory devices as well as the other components used in the cache memory unit 284 may be either embedded or stand-alone devices.

The write buffer 282 in each memory interface 270a-d is used to store write requests while a read request is being serviced. In a such a system, the processor 104 can issue a write request to a system memory device 240a-d even if the memory device to which the write request is directed is busy servicing a prior write or read request. Using this approach, memory requests can be serviced out of order since an earlier write request can be stored in the write buffer 282 while a subsequent read request is being serviced. The ability to buffer write requests to allow a read request to be serviced can greatly reduce memory read latency since read requests can be given first priority regardless of their chronological order. For example, a series of write requests interspersed with read requests can be stored in the write buffer 282 to allow the read requests to be serviced in a pipelined manner followed by servicing the stored write requests in a pipelined manner. As a result, lengthy settling times between coupling write request to the memory devices 270a-d and subsequently coupling read request to the memory devices 270a-d for alternating write and read requests can be avoided.

The use of the cache memory unit 284 in each memory interface 270a-d allows the processor 104 to receive data responsive to a read command directed to a respective system memory device 240a-d without waiting for the memory device 240a-d to provide such data in the event that the data was recently read from or written to that memory device 240a-d. The cache memory unit 284 thus reduces the read latency of the system memory devices 240a-d to maximize the memory bandwidth of the computer system. Similarly, the processor 104 can store write data in the cache memory unit 284 and then perform other functions while the memory controller 280 in the same memory interface 270a-d transfers the write data from the cache memory unit 284 to the system memory device 240a-d to which it is coupled.

Figure 1:
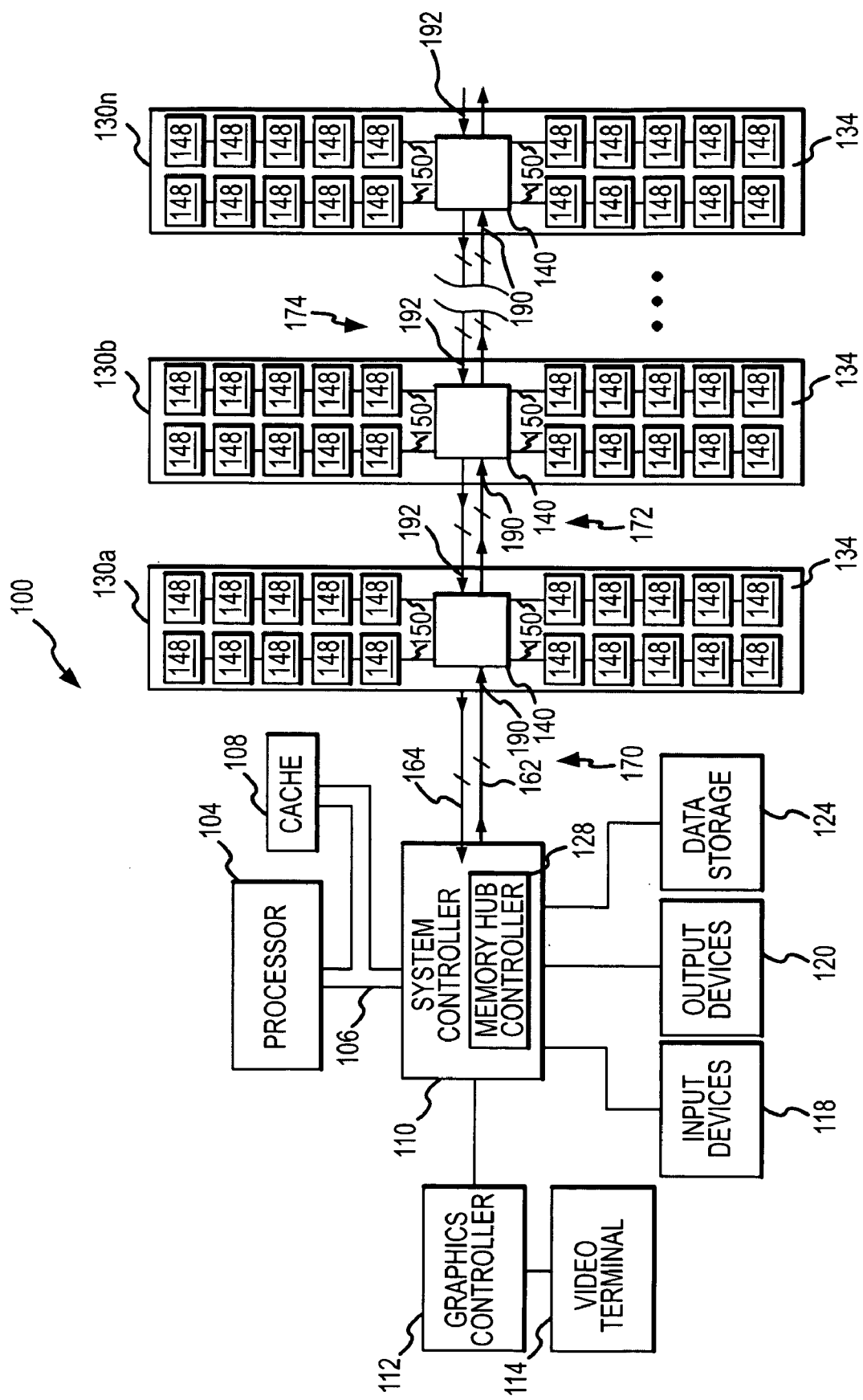
FIG. 1 is a block diagram of a conventional computer system that is capable of using a memory system according to one example of the invention.

Further included in the memory hub 200 is a DMA engine 286 coupled to the switch 260 through a bus 288. The DMA engine 286 enables the memory hub 200 to move blocks of data from one location in the system memory to another location in the system memory without intervention from the processor 104 (FIG. 1). The bus 288 includes a plurality of conventional bus lines and signal lines, such as address, control, data busses, and the like, for handling data transfers in the system memory. Conventional DMA operations well known by those ordinarily skilled in the art can be implemented by the DMA engine 286. The DMA engine 286 is able to read a link list in the system memory to execute the DMA memory operations without processor intervention, thus, freeing the processor 104 and the bandwidth limited system bus from executing the memory operations. The DMA engine 286 can also include circuitry to accommodate DMA operations on multiple channels, for example, for each of the system memory devices in the banks 240a-d. Such multiple channel DMA engines are well known in the art and can be implemented using conventional technologies.

Figure 8:
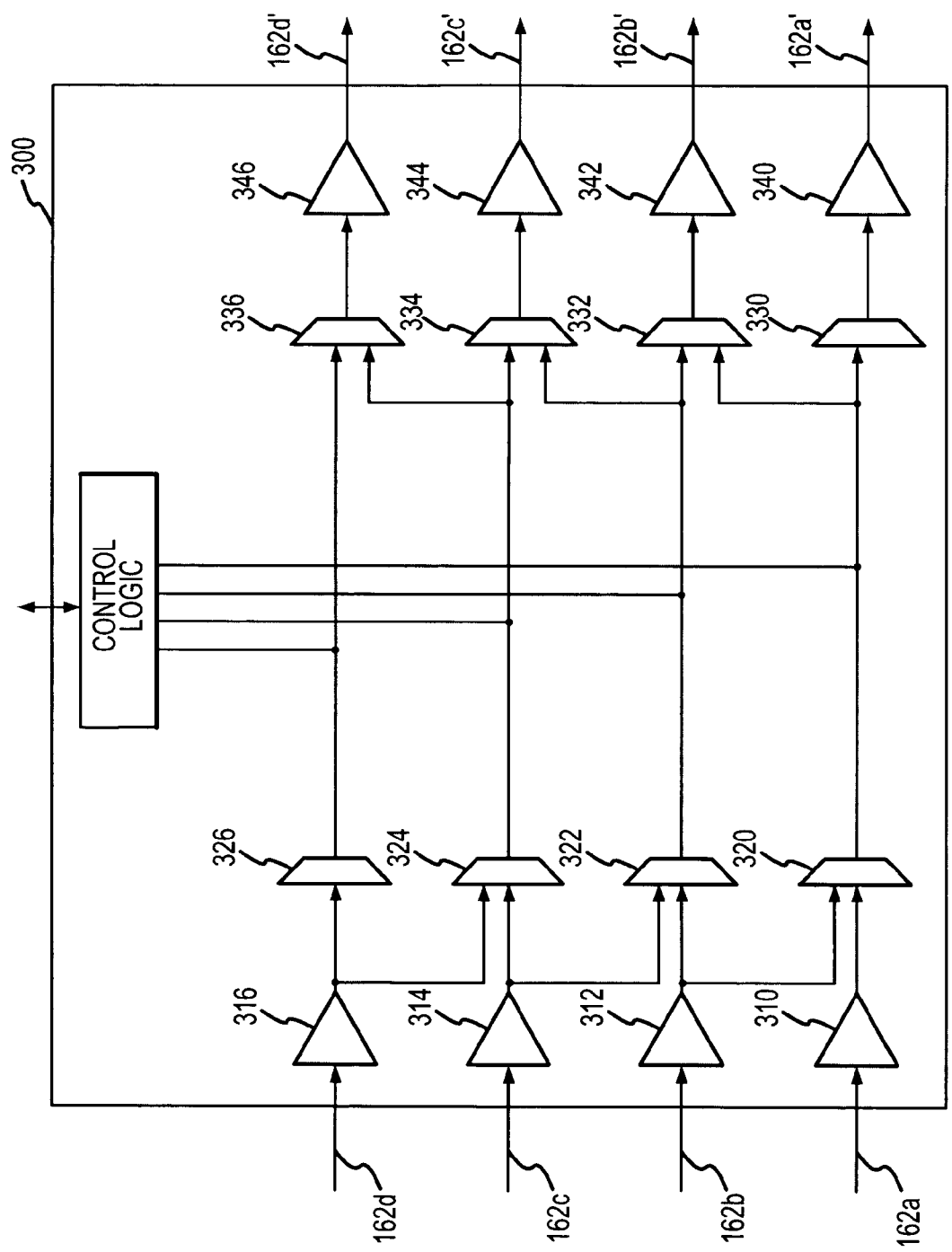
FIG. 8 is a logic diagram showing one example of a switching circuit that may be used to switch downstream bit-lanes in the memory hub of FIG. 7.

One example of a multiplexer 300 that can be used in the switch 260 (FIG. 7) to couple any of the downstream bit-lanes 162a-d in one segment to an adjacent downstream bit-lane 162a'-d' in another bit-line segment is shown in FIG. 8. The multiplexer system 300 includes receivers 310, 312, 314, 316 having their inputs coupled to the respective downstream bit-lanes 162a-d of one segment 305. The outputs of the receivers 310, 312, 314, 316 are coupled to one input of respective multiplexers 320, 322, 324, 326. The outputs of the last three receivers 312, 314, 316 are also coupled to one input of a respective one of the first three multiplexers 320, 322, 324. Thus, for example, the output of the receiver 312 is coupled to both the multiplexer 322 and the multiplexer 320. The outputs of the multiplexers 320, 322, 324, 326 are coupled to control logic 328, which is, in turn, coupled to the memory devices 148 (FIG. 1) on the same memory module 130. The control logic 128 is used for routing local memory requests, i.e. commands, addresses and sometimes write data, to the memory devices 148 in the same module. The outputs of the multiplexers 320, 322, 324, 326 are also coupled to one input of a second set of respective multiplexers 330, 332, 334, 336 for use in coupling memory requests to a downstream memory module 130. The outputs of the first three multiplexers 320, 322, 324 are also coupled to one input of the last three multiplexers 332, 334, 336. The outputs of the multiplexers 330, 332, 334, 336 are coupled to the inputs of respective transmitters 340, 342, 344, 346, which have their outputs connected to respective bit-lanes 162a', 162b', 162c', 162d' of another segment 315.

In operation, each the multiplexers 320, 322, 324, 326 is controlled by a suitable control circuit (not shown) to pass either its respective bit-lane or the adjacent higher bit-lane. Similarly, the multiplexers 330, 332, 334, 336 is controlled by a suitable control circuit (not shown) to pass either its respective bit-lane or the adjacent lower bit-lane. The multiplexer system can therefore couple any of the bit-lanes 162a-d of the segment 305 to either of the adjacent bit-lanes 162a'-d' of the segment 315.

Figure 9:
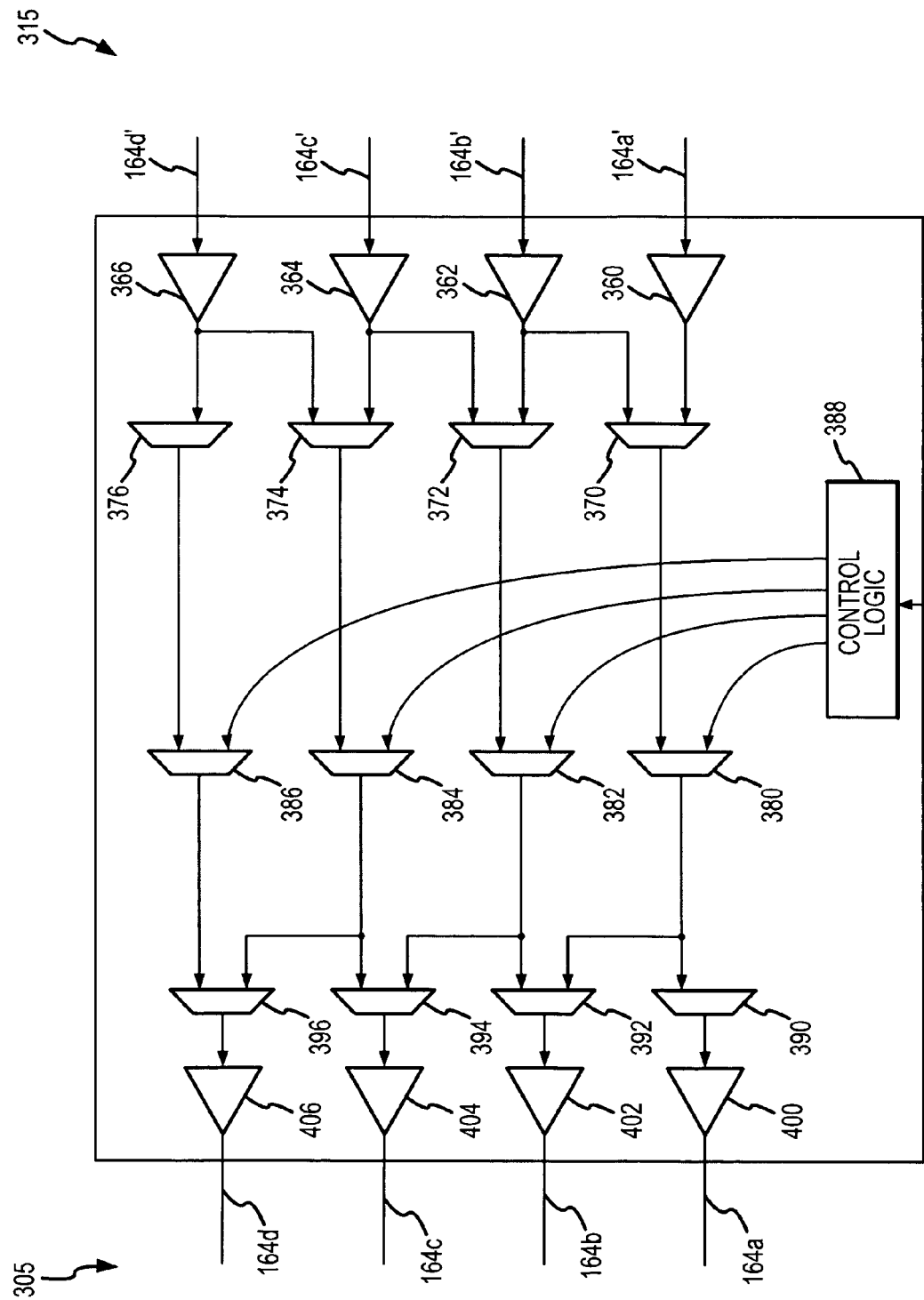
FIG. 9 is a logic diagram showing one example of a switching circuit that may be used to switch upstream bit-lanes in the memory hub of FIG. 7.

With further reference to FIG. 9, a similar multiplexer system 350 is used to couple one segment 315 of the upstream bit lines 164 to another segment 305 of the upstream bit lines 164. The multiplexer system includes receivers 360, 362, 364, 366 having their inputs coupled to the respective upstream bit-lanes 164a'-d' of one segment 315. The outputs of the receivers 360, 362, 364, 366 are coupled to one input of respective multiplexers 370, 372, 374, 376. The outputs of the last three receivers 362, 364, 366 are also coupled to one input of a respective one of the first three multiplexers 370, 372, 374. The outputs of the multiplexers 370, 372, 374, 376 are coupled to a second set of multiplexers 380, 382, 384, 386. A second input of each of these multiplexers 380, 382, 384, 386 is connected to control logic 388, which is, in turn, coupled to the memory devices 148 (FIG. 1) on the same memory module 130. The control logic 128 is used for routing local memory responses, i.e., read data, from the memory devices 148 in the same module. The outputs of the multiplexers 380, 382, 384, 386 are coupled to one input of a second set of respective multiplexers 390, 392, 394, 396 for use in coupling memory responses to either the memory hub controller 128 (FIG. 1) or to an upstream memory module 130. The outputs of the first three multiplexers 390, 392, 394 are also coupled to one input of the last three multiplexers 392, 394, 396. The outputs of the multiplexers 390, 392, 394, 396 are coupled to the inputs of respective transmitters 400, 402, 404, 406, which have their outputs connected to respective bit-lanes 164a, 164b, 164c, 164d of another segment 305.

In operation, the multiplexer system 350 operates in essentially the same manner as the multiplexer system 300 of FIG. 8 to couple any of the bit-lanes 164a'-d' of the segment 315 to either of the adjacent bit-lanes 164a-d of the segment 305.

From the foregoing it will be appreciated that, although specific embodiments of the invention have been described herein for purposes of illustration, it will be understood by one skilled in the art that various modifications may be made without deviating from the spirit and scope of the invention. Accordingly, the invention is not limited except as by the appended claims.

What is claimed is:

1. A memory system, comprising:
   a plurality of memory modules, each of the memory modules comprising:
      a substrate having a first connector and a second connector;
      a plurality of memory devices mounted on the substrate; and
      a memory hub mounted on the substrate and coupled to the plurality of memory devices, the memory hub comprising:
         a first plurality of bit-lane terminals;
         a second plurality of bit-lane terminals;
         at least one memory device interface;
         a switch coupled to the bit-lane terminals in the first and second plurality and to the at least one memory device interface, the switch including a switching circuit that is operable to couple at least some of the bit-lane terminals in the first plurality to either a respective one of the bit-lane terminals in the second plurality or at least one other bit-lane terminal in the second plurality, the switching circuit further being operable to couple at least some of the bit-lane terminals in the first plurality to the at least one memory device interface;
         a memory hub controller having a plurality of bit-lane terminals; and
         a plurality of bit-lanes connecting the bit-lane terminals of the memory hub controller to the bit-lanes in the first plurality of bit-lanes of the memory hub in one of the memory modules, the first plurality of bit-lane terminals of the memory hubs in the other memory modules being connected by respective bit-lanes to respective bit-lane terminals in the second plurality of bit-lanes terminals of the memory hub in another of the memory modules.

2. The memory system of claim 1 wherein the switching circuit is further operable to couple at least some of the bit-lane terminals in the second plurality to the at least one memory device interface.

3. The memory system of claim 1 wherein the at least one other bit-lane terminal in the second plurality to which the switch is operable to couple at least some of the bit-lane terminals in the first plurality comprises a respective bit-lane terminal in the second plurality that is adjacent the bit-lane terminal in the first second plurality that corresponds to the respective bit-lane terminal in the first plurality.

4. The memory system of claim 1 wherein the bit-lane terminals in the first plurality comprise respective bi-directional bit-lane terminals.

5. The memory system of claim 4 wherein the bit-lane terminals in the second plurality comprise respective bi-directional bit-lane terminals.

6. The memory system of claim 1 wherein the bit-lane terminals in the first plurality comprise in number four bit-lane terminals.

7. The memory system of claim 1 wherein the memory devices comprise dynamic random access memory devices.

8. The memory system of claim 1 wherein the switching circuit in the memory hub in each of the memory modules is operable to couple the bit-lane terminals in the first plurality to respective bit-lane terminals in the second plurality that correspond to the respective bit lane terminals of the first plurality in the memory hub controller to which the respective bit-lane terminals in the first plurality are coupled as long as the bit-lanes connecting the respective bit-lane terminals in the second plurality to respective bit-lane terminals in the first plurality in the memory hub in another memory module are operable.

9. A processor-based system, comprising:
   a processing unit operable to perform computing functions;
   a system controller coupled to the processing unit;
   at least one input device coupled to the processing unit through the system controller;
   at least one output device coupled to the processing unit through the system controller;
   at least one data storage devices coupled to the processing unit through the system controller; and
   a plurality of memory modules, each of the memory modules comprising:
      a substrate having a first connector and a second connector;
      a plurality of memory devices mounted on the substrate; and
      a memory hub mounted on the substrate and coupled to the plurality of memory devices, the memory hub comprising:
         a first plurality of bit-lane terminals;
         a second plurality of bit-lane terminals;
         at least one memory device interface;
         a switch coupled to the bit-lane terminals in the first and second plurality and to the at least one memory device interface, the switch including a switching circuit that is operable to couple at least some of the bit-lane terminals in the first plurality to either a respective one of the bit-lane terminals in the second plurality or at least one other bit-lane terminal in the second plurality, the switching circuit further being operable to couple at least some of the bit-lane terminals in the first plurality to the at least one memory device interface;
         a memory hub controller having a plurality of bit-lane terminals, the memory hub controller being coupled to the processing unit through the system controller; and a plurality of bit-lanes connecting the bit-lane terminals of the memory hub controller to the bit-lanes in the first plurality of bit-lanes of the memory hub in one of the memory modules, the first plurality of bit-lane terminals of the memory hubs in the other memory modules being connected by respective bit-lanes to respective bit-lane terminals in the second plurality of bit-lanes terminals of the memory hub in another of the memory modules.

10. The processor-based system of claim 9 wherein the switching circuit is further operable to couple at least some of the bit-lane terminals in the second plurality to the at least one memory device interface.

11. The processor-based system of claim 9 wherein the at least one other bit-lane terminal in the second plurality to which the switch is operable to couple at least some of the bit-lane terminals in the first plurality comprises a respective bit-lane terminal in the second plurality that is adjacent the bit-lane terminal in the first second plurality that corresponds to the respective bit-lane terminal in the first plurality.

12. The processor-based system of claim 9 wherein the bit-lane terminals in the first plurality comprise respective bi-directional bit-lane terminals.

13. The processor-based system of claim 12 wherein the bit-lane terminals in the second plurality comprise respective bi-directional bit-lane terminals.

14. The processor-based system of claim 9 wherein the bit-lane terminals in the first plurality comprise in number four bit-lane terminals.

15. The processor-based system of claim 9 wherein the memory devices comprise dynamic random access memory devices.

16. The processor-based system of claim 9 wherein the switching circuit in the memory hub in each of the memory modules is operable to couple the bit-lane terminals in the first plurality to respective bit-lane terminals in the second plurality that correspond to the respective bit lane terminals of the first plurality in the memory hub controller to which the respective bit-lane terminals in the first plurality are coupled as long as the bit-lanes connecting the respective bit-lane terminals in the second plurality to respective bit-lane terminals in the first plurality in the memory hub in another memory module are operable.

17. The processor-based system of claim 9 wherein the memory hub controller is integrated within the system controller.

18. In a memory system having a plurality of memory modules each of which includes a memory hub and a plurality of memory devices, the memory system further having a controller connected to the memory hub in one of the memory modules through a first plurality of bit-lanes, the memory hub in each of the other memory modules being coupled to one of the memory hubs in another of the memory modules, a method of coupling signals between the controller and memory modules, comprising:

if each of the bit-lanes connected between the memory hub in one of the memory modules and the memory hub in another of the memory modules is operable, coupling signals through the respective bit-lanes from the one memory module to the other memory module using the same bit-lanes on which the respective signals were received by the one memory module, and coupling signals through the respective bit-lanes to the one memory module from the other memory module using the same bit-lanes on which the respective signals are transmitted by the one memory module; and if any of the bit-lanes connected between the memory hub in one of the memory modules and the memory hub in another of the memory modules is inoperable, coupling signals through the respective bit-lanes from the one memory module to the other memory module using bit-lanes that are different from the bit-lanes on which the respective signals were received by the one memory module, and coupling signals through the respective bit-lanes to the one memory module from the other memory module using bit-lanes that are different from the bit-lanes on which the respective signals are transmitted by the one memory module.

19. The method of claim 18 wherein if any of the bit-lanes connected between the memory hub controller and the memory hub in the one memory module is inoperable, coupling signals through the respective bit-lanes from the memory hub controller to the one memory module using bit-lanes that are different from the inoperable bit-lane, and coupling signals through the respective bit-lanes to the memory hub controller from the one memory module using bit-lanes that are different from the inoperable bit-lane.

* * * * *

UNITED STATES PATENT AND TRADEMARK OFFICE
CERTIFICATE OF CORRECTION

PATENT NO. : 7,353,316 B2
APPLICATION NO. : 11/388296
DATED : April 1, 2008
INVENTOR(S) : Erdmann Page 1 of 1

It is certified that error appears in the above-identified patent and that said Letters Patent is hereby corrected as shown below:

On the Title page Item (57), under "Abstract", line 8, delete "the a" and insert -- a --, therefor.

Signed and Sealed this

Twenty-fourth Day of June, 2008

JON W. DUDAS
*Director of the United States Patent and Trademark Office*